US006690243B1

(12) United States Patent
Henrion

(10) Patent No.: US 6,690,243 B1
(45) Date of Patent: Feb. 10, 2004

(54) MULTI-PHASE VOLTAGE-CONTROLLED OSCILLATOR AT MODULATED, OPERATING FREQUENCY

(75) Inventor: Widge S. Henrion, Austin, TX (US)

(73) Assignee: Cypress Semiconductor Corp., San Jose, CA (US)

( * ) Notice: Subject to any disclaimer, the term of this patent is extended or adjusted under 35 U.S.C. 154(b) by 50 days.

(21) Appl. No.: 09/878,074

(22) Filed: Jun. 7, 2001

(51) Int. Cl.$^7$ ................................................. H03B 5/00
(52) U.S. Cl. ..................... 331/117 R; 331/57; 331/175; 331/167
(58) Field of Search ............................. 331/45, 50, 57, 331/117 R, 172, 175, 116 R, 117 FE, 116 FE, 167, 135

(56) References Cited

U.S. PATENT DOCUMENTS

| 5,561,398 | A | * | 10/1996 | Rasmussen | ........... 331/116 FE |
| 5,561,399 | A | * | 10/1996 | Haartsen | ................. 331/117 R |
| 6,111,456 | A | * | 8/2000 | Saito et al. | .................. 327/437 |
| 6,124,763 | A | * | 9/2000 | Lemaire | ....................... 331/45 |
| 6,198,360 | B1 | | 3/2001 | Henrion | |

OTHER PUBLICATIONS

Savoj et al., "A 10Gb/s CMOS Clock and Data Recovery Circuit with Frequency Detection," ©IEEE 2001, 4 pgs.

* cited by examiner

*Primary Examiner*—Robert Pascal
*Assistant Examiner*—Kimberly E Glenn
(74) *Attorney, Agent, or Firm*—Kevin L. Daffer; Conley Rose P.C.

(57) ABSTRACT

A circuit and method are disclosed herein for a multi-phase voltage-controlled LC oscillator. The oscillator is configured as a ring containing N sections, each of which has an LC tank circuit that determiines the oscillation frequency. All the oscillator sections produce a signal at the same frequency, but with a constant phase angle offset between one section and the next. Thus, for example, a 4-phase version of the oscillator would have 4 sections, producing signals with phase angles of 0°, 90°, 180°, and 270°. The phase offset in each section results from the use of amplified quadrature signals to drive the LC circuits. An advantage of this approach to obtaining multiple phases is enhanced frequency stability, since the LC circuits in the oscillator sections all operate at resonance. Frequency modulation is accomplished without the use of varactors or other voltage-controlled tuning devices. Instead, a quadrature current summed into the LC tank circuit of each section increases or decreases the resonant frequency. A transconductance amplifier regulates the quadrature current, so the oscillation frequency can be controlled using an external voltage.

18 Claims, 13 Drawing Sheets

MULTI-PHASE VOLTAGE-CONTROLLED OSCILLATOR AT MODULATED, OPERATING FREQUENCY

BACKGROUND OF THE INVENTION

1. Field of the Invention

This invention relates to electronic oscillators, and more particularly to a circuit and method for a multi-phase voltage controlled oscillator (VCO). Described herein are means for creating a VCO with multiple outputs, all operating at the same frequency, but each having a different phase relationship. For example, in an embodiment disclosed herein, the VCO generates four sine wave outputs at the same frequency and phase offsets of 0°, 90°, 180° and 270°. This configuration-is referred to as a "quadrature oscillator." Oscillators having multiple phase outputs (i.e., multi-phase oscillators) are useful in applications such as clock recovery circuits incorporating phase-locked loops (PLLs) or delay-locked loops (DLLs). In some cases, it is possible to operate the PLL (or DLL) and the associated VCO at lower frequencies, if the VCO is capable of generating multiple output phases. This is advantageous, since the lower frequency circuitry is generally easier to design and cheaper to manufacture. The circuit and method disclosed herein support the generation of clock signals of four, eight, or arbitrarily many output phases, while overcoming many disadvantages inherent in conventional multi-phase oscillators.

2. Description of the Related Art

Modern high-speed data communications systems typically employ internal clock-referenced circuitry. It is often necessary for such circuitry to adjust its own operating frequency to match that of an incoming data stream. For example, a SONET bit stream is considered isonchronous with respect to the internal clock rate of a node receiving the stream. This means that, although their average clock rates are very close, the bit stream data rate is not actually synchronized with the circuitry in the SONET node. To achieve synchronization, the node adjusts its internal clock slightly to match the bit stream data rate. This is accomplished by a clock recovery circuit, which derives the necessary clock rate from the bit stream. Such circuits generally employ PLLs, or DLLs.

In its most basic form, a PLL consists of a variable oscillator combined with phase detection and control circuitry. The signal generated by the oscillator is continuously compared against an incoming clock signal, and the control circuitry adjusts the oscillator output frequency so the incoming clock signal and oscillator output are in phase. A PLL may be used, for example, to synchronize logic local to the PLL with the frequency and/or phase of an external clock signal, as may be required for data communications.

In contrast, a DLL contains a variable delay line combined with delay detection and control circuitry. A reference clock is supplied to both the variable delay in the DLL and to a clock distribution network in the external circuitry. The DLL control circuitry compares the clock signal fed back from the distribution network against the output of the variable delay, and then adjusts the variable delay until the two clocks match. In this manner, a DLL can compensate for the delay in the clock distribution network.

In clock recovery systems, or other high-speed applications employing PLLs or DLLs, it is often convenient or beneficial to use a multi-phase clock. For example, the phase detector in a typical clock recovery circuit requires both the rising and falling edges of an incoming clock (e.g., clock to be recovered) to achieve synchronization. Therefore, with a single-phase clock signal, the clock rate must equal the data rate of the incoming bit stream. If the clock generates multiple phases, however, the clock rate may be reduced, while still permitting the phase detector to accurately track the effective bit rate of the incoming data. SONET bit streams may have bit rates as high as 10 Gbps, or even 40 Gbps (e.g., SONET/SDH standard OC-192 specifies a transmission rate of 9953.28 Mbit/s, and OC-768 specifies a transmission rate of 39813.12 Mbit/s). Consequently, the PLL and other components of the clock recovery circuit are significantly simpler with a multi-phase oscillator than. with one providing only a single output phase. For the purposes of this specification, an oscillator with outputs at 0° and 180° (i.e., a differential output) will be considered a two-phase oscillator.

There is a simple way to derive a multi-phase oscillator from a single-phase oscillator. A single-phase oscillator can be run at a multiple of the desired frequency and its output divided down and separated into multiple phases using standard logic. For example, to create a 100 MHz four-phase oscillator, one could start with a single-phase oscillator running at 200 MHz. The 200 MHz output of this oscillator could be coupled to a divide-by-two counter. The two complementary outputs of each flip-flop would then yield a differential pair of 100 MHz waveforms (i.e., 180° out of phase with each other) that were 90° out of phase with the respective outputs of the other flip-flop.

Unfortunately, it is not always a simple matter to run the oscillator and the divider at twice (or more) the necessary frequency. Furthermore, the phase/frequency detectors used in some clock recovery circuits require as many as 4 or 8 phases. Using the above approach, it would be necessary to start with a oscillator running at 8 times the bit rate, which may be impractical, if the targeted bit rate is quite high. In such cases, there is no alternative but to create an oscillator that.directly generates the multi-phase signals.

There are a variety of ways to create a multi-phase oscillator without multiplying and thereafter dividing the oscillator output. A classic approach, known as a RC ring oscillator, consists of series-connected phase shift stages, in which the combined phase shift is sufficient to achieve oscillation at the desired operating frequency. For example, a quadrature RC ring oscillator can be formed by connecting four stages in series, each stage having a phase shift of 90° at the desired frequency. By connecting the inverted output of the fourth stage to the input of the first, an overall phase shift of 360° results. If there is enough gain, the RC ring oscillator will sustain oscillation. During oscillation, each stage of the RC ring oscillator produces an output signal at a frequency determined by the RC networks, with a phase angle that is a multiple of 90°. Although this technique is straightforward, it tends to be noisy and lacks sufficient frequency stability for many applications.

A better approach, the LC ring oscillator, uses both inductors and capacitors in the phase shift stages. ("LC" oscillators are so named because the traditional symbols for inductance and capacitance are L and C, respectively). Each LC combination has a characteristic resonant frequency. At the resonant frequency the impedance of the LC network becomes real (since, at resonance, the inductive and capacitive reactance become equal in magnitude and opposite in sign, and therefore, cancel). An LC ring oscillator will preferentially oscillate at the resonant frequency of the LC networks in its stages. The LC combination is often referred to as a "tank circuit", and the resonant frequency is based on the component values in the tank:

$$f_R = \frac{1}{2\pi\sqrt{LC}}$$

where $f_R$ is the resonant frequency (in Hertz), L is the inductance (in Henries), and C is the capacitance (in Farads). When operated at its natural resonant frequency, the frequency stability of a properly designed LC ring oscillator is inherently better than that of oscillators based on RC phase shift networks. This is because the rate of change of phase with respect to frequency is much greater for the LC tank circuit than for an RC circuit. In order to generate multiple output phases, however, LC ring oscillators are typically not operated at the exact resonant frequency, but are slightly "detuned." As a result, their frequency stability is no better than that of an RC ring oscillator, and may limit their performance in high-speed clock recovery applications.

A further consideration with regard to multi-phase oscillators is frequency modulation. As in the case of the SONET node discussed earlier, it is often necessary to adjust the frequency of the oscillator. This is conventionally done through the inclusion of a variable reactive component (i.e., inductance or capacitance) in the tank circuit of the oscillator. In the above equation, the resonant frequency is inversely proportional to the product of the inductance and capacitance; therefore, varying either the capacitance or the inductance changes the operating frequency of the oscillator. When the variable reactive component is voltage-dependent, the frequency of the oscillator may be adjusted through the application of an external control voltage. This is a basic form of voltage controlled oscillator (VCO).

While voltage-dependent inductors are uncommon, voltage-dependent capacitors are widely used in VCOs, voltage-controlled filters, etc. The most common form of voltage-dependent capacitor is the varactor. A varactor is a semiconductor junction that is biased in the reverse direction and can be tuned over a range of capacitance by varying its junction voltage. The varactor is convenient to use, and its capacitance can be adjusted over a ratio of up to 2:1. Despite these advantages, there are some undesirable characteristics of a varactor tuned VCO, which may render them unsuitable for certain applications. For one thing, the tuning range is a function of the square root of the total capacitance, which includes parasitic capacitances. Parasitic capacitance is typically associated with the device interconnect wiring and cannot be completely eliminated. Furthermore, the parasitic capacitance may be comparable in size to the junction capacitance of the varactor. For example, when one sets out to fabricate a varactor with a nominal tuning range of 4–8 pF, the actual device may have parasitics of as much as 4 pF, making the total tuning range of the capacitance 8–12 pF. This effectively reduces the practical tuning range of the varactor to $\sqrt{12/8} \cong 1.22$.

Although laser trimming can often be employed to "tweak" the varactor for the desired range, this adds to the cost of manufacturing the integrated circuit. Furthermore, since varactors are not purely capacitive, their resistive component can degrade the "Q" of an LC circuit, thereby diminishing the frequency stability of the oscillator. Moreover, the capacitance vs. voltage characteristic of the varactor is nonlinear, which complicates the design of frequency control circuitry in the oscillator.

It would be desirable to have a multi-phase oscillator circuit using LC components that overcomes the aforementioned drawbacks. The desired oscillator should be capable of operating at its resonant frequency, for optimum frequency stability. The design of the oscillator should be such that it may be readily fabricated upon and within a common substrate, as an integrated circuit. Furthermore, it should be possible to adapt its principles of operation to achieve other desired numbers of output phases.

In addition, it would also be desirable to have a means of modulating the frequency of oscillation, while avoiding many of the problems associated with varactor tuning. It would be particularly advantageous to have a wide tuning range, and a frequency vs. voltage tuning characteristic that is substantially linear. In addition, the modulation circuitry should minimize any degradation of the frequency stability of the oscillator.

SUMMARY OF THE INVENTION

The problems outlined above may be addressed by a circuit and method disclosed herein for a multi-phase LC oscillator. The present oscillator may have 4 or 8 phases, or alternatively, more than 8 phases. The circuit disclosed herein is believed to offer advantages over conventional oscillators, in that it avoids de-tuning the resonant stages to achieve the necessary inter-stage phase shift. Instead, a phase-shifted signal derived from the LC circuit of each stage is amplified and used (possibly in combination with phase-shifted signals from other stages) to drive the following stage. This mode of operation permits the LC circuits to be operated at their resonant frequency, so frequency stability is optimized.

An N-stage LC oscillator circuit is disclosed herein. The N stages are series-connected, in a ring configuration. Each stage contains an LC circuit and an amplifier, and the amplifier in each stage receives a quadrature signal from at least one other stage. Thus, the signal with which the amplifier drives its associated LC circuit has a phase offset, relative to the at least one other stage. If the oscillator has N stages, the $n^{th}$ stage has a phase offset of $n \times (360° \div N)$. Additional gain is obtained from the amplifier in each stage, by coupling to it a signal that is 180° out of phase with the drive signal to the LC circuit.

A circuit for modulating the frequency of the N-stage multi-phase oscillator is also disclosed herein. The circuit does not rely on the use of varactors or other similar voltage-controlled reactance devices to adjust the oscillator frequency. Instead, a voltage-controlled transconductance amplifier couples a quadrature current into the LC circuit of each oscillator stage. The quadrature current is at the same frequency, but has a phase angle of either +90° or −90° with respect to the voltage across the LC circuit. Increasing the amplitude of a quadrature signal with a phase angle of −90° causes the operating frequency of the oscillator to increase above the resonant frequency of the LC circuit; increasing the amplitude of a quadrature signal with a phase angle of +90° causes operating frequency of the oscillator to decrease below the resonant frequency of the LC circuit. The phase angle and amplitude of the quadrature signal are both determined by the voltage-controlled transconductance amplifier, which is based on a Gilbert cell analog multiplier.

A method for obtaining N phases from an LC oscillator is also disclosed herein. The method entails series-connecting N identical oscillator sections in a ring configuration, where each section contains an amplifier driving an LC circuit. A quadrature signal is generated from the LC circuit of each oscillator section, where the quadrature signal is 90° out of phase with the voltage across the LC circuit. The method further entails combining one or more of the quadrature signals from other oscillator sections in the amplifier that drives the LC circuit in a given section. According to this method, the phase angle of the voltage across the LC circuit in the $n^{th}$ oscillator section is $n \times (360° \div N)$. The method further discloses coupling to the amplifier in each section a signal that is 180° out of phase with the drive signal to the LC circuit, thus obtaining additional gain from the amplifier.

A method for modulating the frequency of an LC oscillator is also disclosed herein. The method entails coupling a variable amplitude quadrature signal into the LC circuit of the oscillator. With respect to the voltage across the LC circuit, the quadrature signal has the same frequency and a phase angle of +90° or −90°. According to the method, increasing the amplitude of a −90° quadrature signal increases the operating frequency of the oscillator above the resonant frequency of the LC circuit, while increasing the amplitude of a +90° quadrature signal decreases the operating frequency. In an embodiment of the method, a Gilbert cell-type transconductance amplifier controls the sign and amplitude of the quadrature signal.

BRIEF DESCRIPTION OF THE DRAWINGS

Other objects and advantages of the invention will become apparent upon reading the following detailed description and upon reference to the accompanying drawings. in which.

Figure 1A:
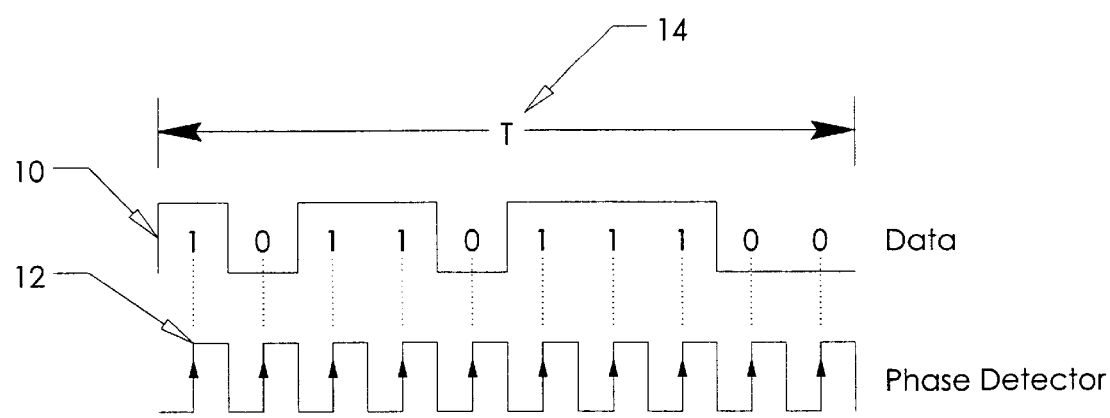
FIGS. 1a–b compare clock recovery by phase detectors using single-phase and multi-phase clocks.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

As noted above, voltage-controlled multi-phase oscillators are often employed in clock recovery circuits. For example, multi-phase oscillators permit the use of half-rate or quarter-rate phase detectors in the clock recovery circuitry. This is an important advantage for applications such as high-speed data communications, since this allows the clock recovery circuitry to operate at lower clock rates than that of the incoming data stream. The difficulty and cost of designing ultra high-speed clock recovery circuitry are thus avoided.

Figure 1B:
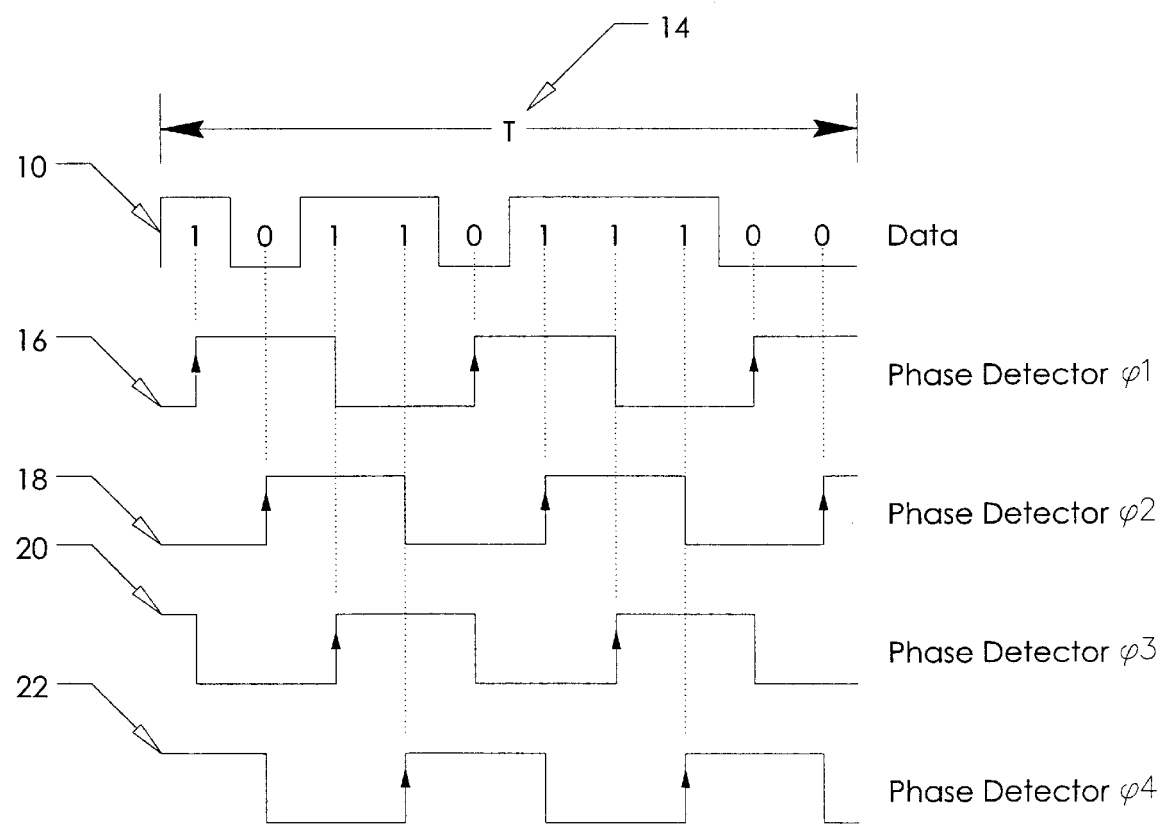

FIGS. 1a and 1b illustrate the benefit of using a multi-phase oscillator in a clock recovery system. FIG. 1a compares a bit stream 10 to the timing of a phase detector 12 operating at the same clock rate. The data states are represented by 1's and 0's, and there are 10 bits during the interval T, shown as reference. numeral 14. Thus, if T=1 ns, the data rate would be 10 Gbps. It is assumed that the phase detector has "locked on" to the data rate, and detects the state of the data on the rising edge of each clock cycle (as indicated by the dotted lines). Consequently, the phase detector must be capable of operation at a frequency of at least 10 GHz.

In FIG. 1b, a 4-phase oscillator running at one quarter the data rate allows a one-fourth-rate phase detector to detect the state of the same bit stream 10 on the rising edge of each of the four phases 16–22. If T=1 ns, the data rate is 10 Gbps, as before. In this case, however, the phase detector need only operate at 2.5 GHz. Such a reduction in the required operating frequency may simplify the design and lower the cost of the phase detector and other clock recovery circuitry.

Figure 2:
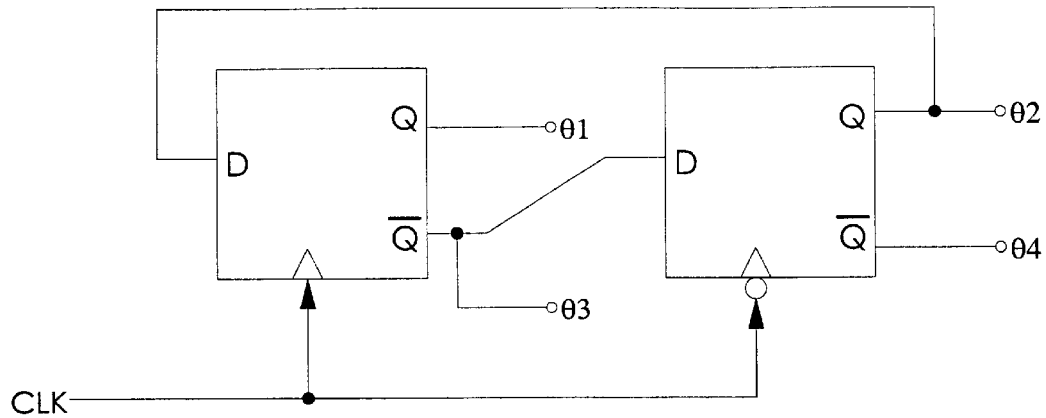
FIG. 2 illustrates multi-phase clock generation by dividing down a higher clock rate.
Figure 2:
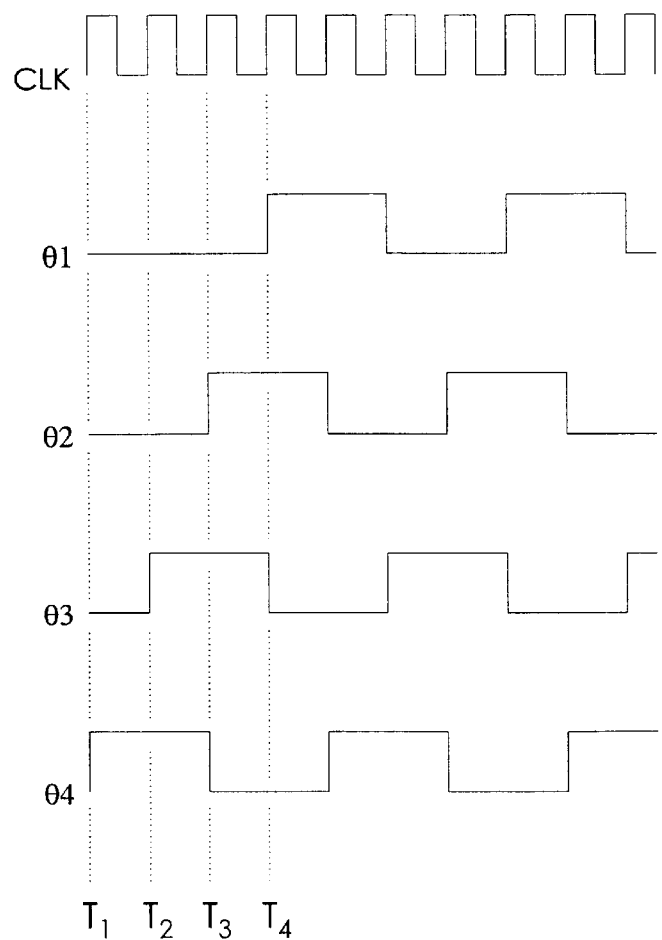

Although there are benefits to their use, many of the most common multi-phase oscillator designs suffer from a variety of weaknesses. One of the simplest ways to create a clock signal with multiple phases is to run an oscillator at a multiple of the desired frequency, and employ standard logic to derive lower rate, phase-offset signals from the oscillator output. For example, the 4-phases in FIG. 1b might be obtained as shown in FIG. 2. A divider, comprised of two flip-flops 50 and 52, divides a 10 GHz clock signal 54 by a factor of 4. The four outputs of the divider yield identical versions of a 2.5 GHz clock signal 56–62, delayed by 0, ¼, ½, and ¾ clock cycles respectively. This is equivalent to a 2.5 GHz oscillator with outputs at phase angles of 0°, 90°, 180°, and 270°. The difficulty with this approach is that a 10 GHz oscillator is likely to be more difficult and expensive to build than one designed to operate at 2.5 GHz. The ÷4 logic and shift register are also more problematic at the higher clock rate. Consequently, this approach to deriving a multi-phase oscillator becomes impractical at higher frequencies.

Figure 3:
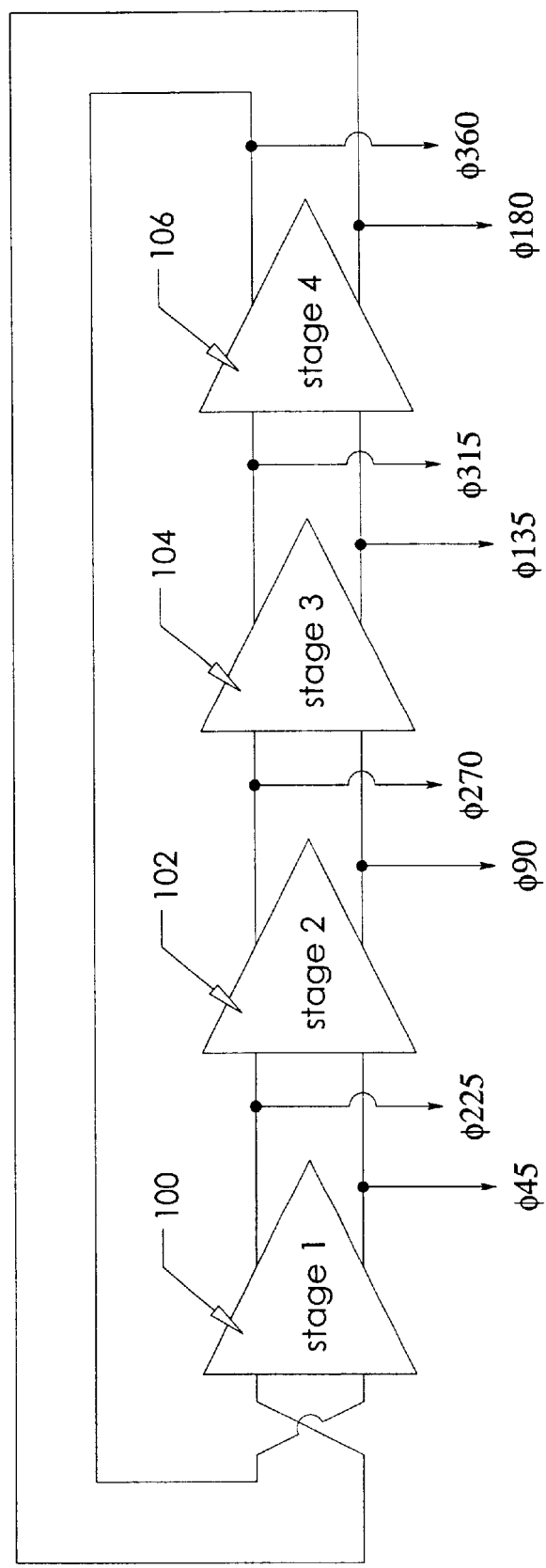
FIG. 3 contains a block diagram of a 4-stage ring oscillator.

An eight-phase, four-stage "ring" oscillator is a multi-stage oscillator, wherein a signal experiences a phase shift of 45° at the oscillator frequency as it propagates through each stage. The output of the last stage is inverted, giving a cumulative phase shift of 360° when coupled back to the input of the first stage (completing the "ring"). Conveniently, the intermediate stages of the ring oscillator provide multiple output signals, with corresponding phase shifts. FIG. 3 contains a block diagram of a 4-stage ring oscillator, with 8 output phases. As represented in FIG. 3, each stage of the oscillator has a differential input and produces a differential output—i.e., a pair of complementary output signals, 180° out of phase with each other. For example, the input to stage 1, shown as reference numeral 100, consists of two signals—one with a 0° phase angle, and the other with a 180° phase angle. Each of the four stages contributes an additional 45° of phase delay to the differential signal pair at its inputs. Therefore, stage 1 produces two signals—one with a 45° phase angle, and the other with a 225° phase angle. The same thing occurs in stages 2, 3, and 4 (102, 104, and 106, respectively). Cross-coupling the outputs of stage 4 (item 106) to the inputs of stage 1 (item 100) produces the regenerative feedback needed for oscillation. For four-stage ring oscillators with only RC components, the optimum phase shift (i.e., the phase shift where the rate of change of phase with respect to frequency is maximum) is 45°.

As discussed earlier, the frequency of oscillation in the ring oscillator can also be determined by the phase shift due to an inductor-capacitor pair, in a network commonly referred to as a tank circuit. The voltage across a resistor is in phase with the current through the resistor, and the ratio of the voltage to the current defines the resistance value of the resistor. In contrast, the voltage across an inductor or capacitor leads or lags the current through the inductor or capacitor by 90°, respectively. Inductors and capacitors are therefore described as reactive, as opposed to resistive, components. By the same token, the ratio of voltage across an inductor or capacitor to the current through the inductor or capacitor is known as the inductive or capacitive reactance, respectively. In general, for a network containing a combination of resistance and capacitive or inductive reactance, the ratio of voltage to current is known as the impedance.

Inductors and capacitors are complementary. Inductive reactance is positive, while capacitive reactance is negative. Moreover, inductive reactance increases in magnitude with frequency, while capacitive reactance decreases. The impedance of a tank circuit comprising a parallel combination of an inductor and capacitor is given by:

$$Z(\omega) = \frac{j\omega \cdot L}{1 - \omega^2 \cdot L \cdot C}$$

where L is inductance (in Henries), C is capacitance (in Farads), and ω is frequency (in radians per second). Note that Z(ω) becomes infinite when $\omega^2 LC=1$. The resonant frequency is the frequency at which this occurs, i.e.

$$\omega = \frac{1}{\sqrt{L \cdot C}}$$

Equivalently, the resonant frequency is defined as the frequency at which the inductive and capacitive reactances cancel. A tank circuit operating at its resonant frequency is said to be "resonating," or "at resonance."

Oscillation occurs most efficiently, and frequency stability is enhanced when the oscillator is operated at its resonant frequency. Unfortunately, an 8 phase ring oscillator requires that the tank circuits. operate slightly off the resonant frequency, in order to achieve the 45° phase shift per stage. Thus, frequency stability is compromised.

According to the principles of an enhanced circuit, quadrature currents, derived in each stage of a multi-stage oscillator, are employed to ensure a 90° phase shift between successive stages. Embodiments of this circuit with four and eight output phases will be described, but the principles upon which the oscillator circuit is based may be applied to obtain any even number of output phases. Advantageously, the multi-phase oscillator circuit disclosed herein does not require operation at a frequency higher than the desired output frequency to derive the multiple phases. Furthermore, it operates at the resonant frequency of the tank circuit, resulting in excellent frequency stability.

Figure 4A:
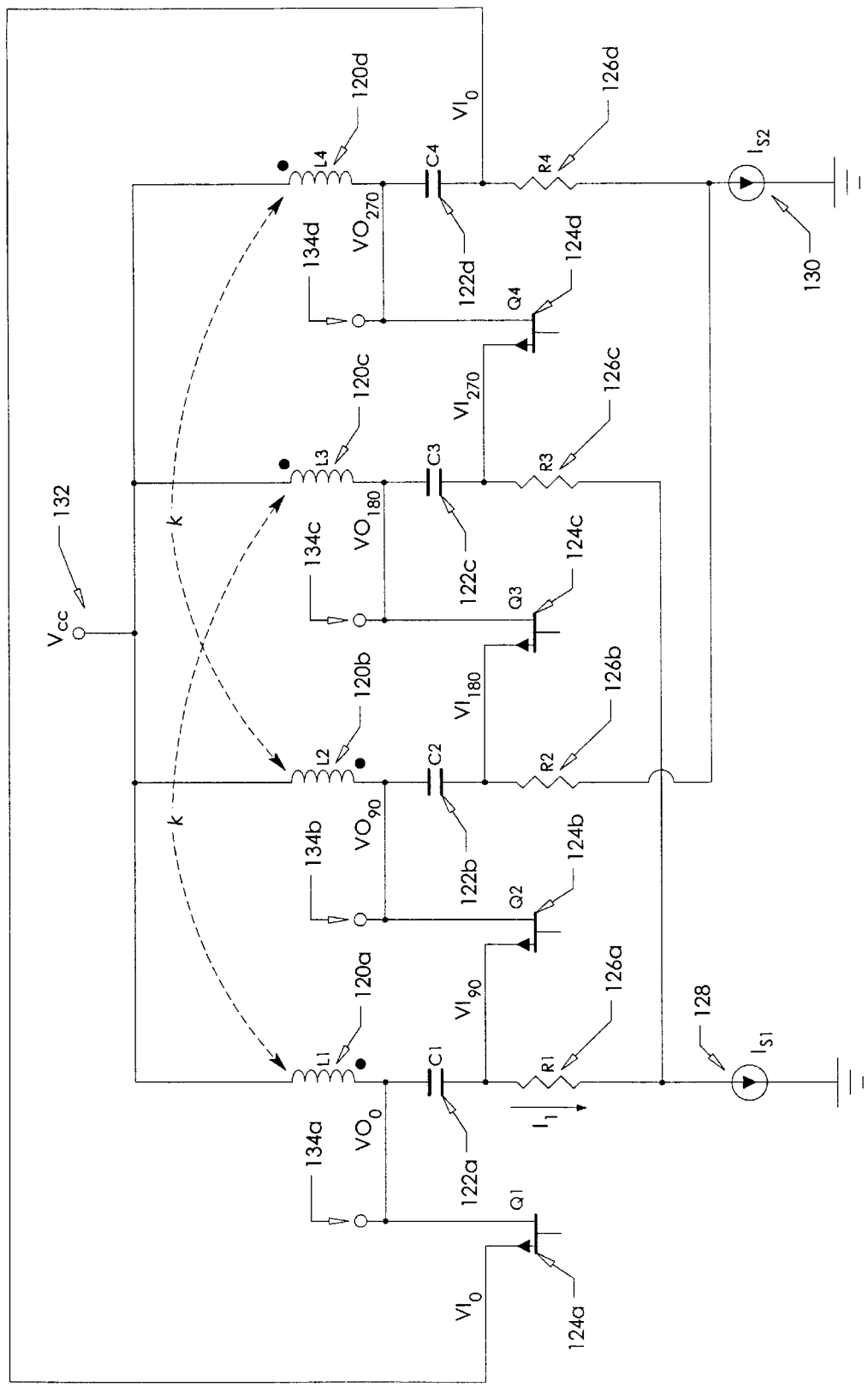
FIGS. 4a–b illustrate an embodiment of a 4-phase oscillator.

The schematic in FIG. 4a represents an embodiment of the multi-phase oscillator circuit disclosed herein. In this case, a 4-phase LC oscillator is shown. The circuit consists of 4 identical sections connected in a ring configuration. All the sections oscillate at the same frequency; but in each section, the signal is offset by a phase angle of 90° with respect to the previous section (i.e., quadrature phases). In FIG. 4a, components which have counterparts in each section have a letter appended to their item number. For example, the inductor in the $2^{nd}$ section is 120b, while the inductor in the $4^{th}$ section is 120d.

In each section, the frequency of oscillation is determined by the resonant frequency of the inductor 120a–d and capacitor 122a–d in the respective tank circuit. A potential advantage of LC oscillators (compared to RC oscillators, multi-vibrators, etc.) is that the reactive components in the tank circuit exhibit a resonant frequency. When the tank circuit is operated at resonance, its frequency stability can be very good. The frequency stability of a resonant LC circuit depends on how closely its reactive components approximate ideal (i.e., non-resistive) inductors or capacitors. For example, an actual capacitor may be represented as an ideal capacitance C in series with a resistance $R_S$. The Q (or, "quality" factor) of the capacitor can then be stated as:

$$Q = \frac{1}{\omega_0 \cdot C \cdot R_S}$$

where $\omega_0$ is the resonant frequency of the tank circuit. This equation indicates that the smaller the series resistance of the capacitor, the higher the Q of the tank circuit, and the better the frequency stability of the oscillator.

Since matching components are used in all the tank circuits, each section has the same resonant frequency. Amplification provided by transistors Q1–Q4 (124a–d) sustains oscillation. The drain of each transistor drives the tank circuit for the respective oscillator section, and provides an output signal suitable for coupling to external circuitry (134a–d). In FIG. 4a, input signals to each transistor are denoted VIn, where n is the phase angle of the signal (n=0, 90, 180 or 270). Similarly, output signals are denoted VOn. Thus, for example, the drain of transistor Q1 124a is connected to the junction of L1 120a and C1 122a, and provides the output signal $VO_0$, while its source receives input signal $VI_0$ from the junction of C4 122d and R4 126d. Inductors LI 120a and L3 120c are mutually coupled, as are L2 120b and L4 120d, with coupling coefficient k and polarity as indicated. The current from each pair of oscillator sections with coupled inductors flows through a common current source. Current source $I_{S1}$ 128. serves the 1st and 3rd sections, while current source $I_{S2}$ 130 serves the $2^{nd}$ and $4^{th}$ sections. A single voltage source, $V_{CC}$ 132, supplies the entire oscillator. For simplicity, the gate of each transistor is shown unconnected. In the discussion that follows, it should be assumed that the gate is tied to a constant voltage, so that each transistor is operating in the "common gate" configuration. In this configuration the transistor produces voltage amplification without phase inversion.

To understand the operation of the multi-phase oscillator in FIG. 4a, first consider just the section comprised of L1 120a, C1 122a, Q1 124a, and R1 126a, and begin with the assumption that the tank circuit consisting of L1 120a and C1 122a is oscillating. Further assume that resistor R1 126a in parallel with the input resistance of transistor Q2 124b is very small (so it does not appreciably degrade the Q of the resonant tank circuit). Since the parallel combination of R1 and the input resistance of Q2 is in series with C1, the voltage appearing across this combination is proportional to the current through capacitor C1. However, the current through a capacitor leads the voltage across it by 90°.

Therefore, the voltage across R1 is 90° out of phase with the voltage across C1—which is to say, the voltage across R1 is 90° out of phase with $VO_0$, the output voltage of the first oscillator section. The other 3 sections operate in the same manner, resulting in another 270° of phase shift. Thus, the voltage across resistor R4 126d is proportional to the current through capacitor C4 122d, and leads the voltage $VO_{270}$ 134d by 90°. The voltage across R4 is therefore in phase with the output of the $1^{st}$ oscillator section ($VO_0$ 134a), and is fed back as input signal $VI_0$ to transistor Q1 124a. The in-phase feedback reinforces the original signal and enables continuous oscillation.

Figure 4B:
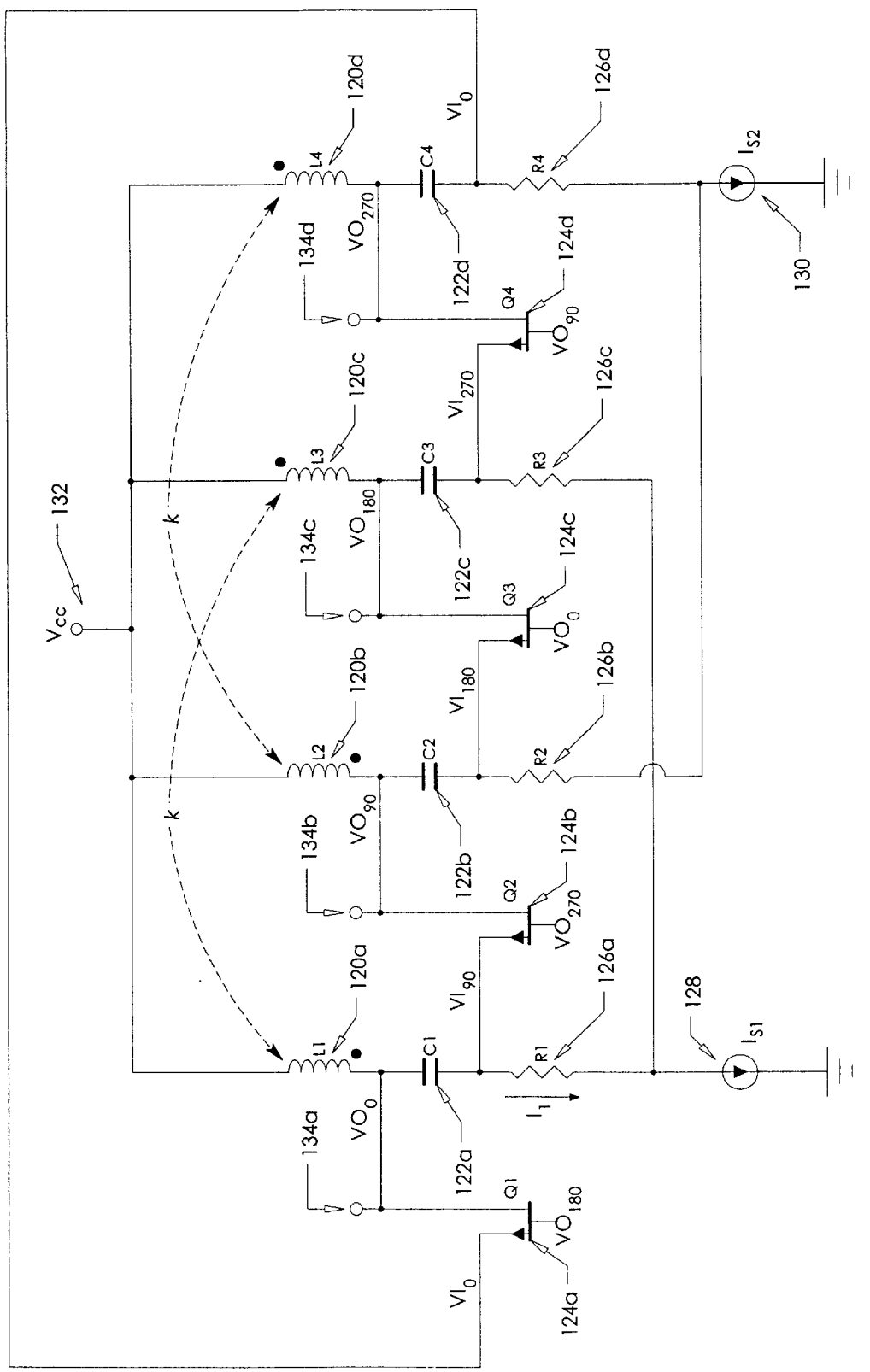

In the circuit shown in FIG. 4a, the gates of transistors Q1–Q4 (124a–d) were left unconnected. In a practical circuit, each gate is driven by a signal 180° out of phase with the signal at the source of the transistor. This effectively transforms the transistor stage from a "common gate" to a combination "common source/common gate" configuration, which provides current and voltage amplification (i.e., power gain) required for oscillation. FIG. 4b represents the same oscillator embodiment shown in FIG. 4a, but with the gates of the transistors driven as described. Thus, for example, the gate of transistor Q2 124b receives signal $VO_{270}$ (the output of transistor Q4 124d). Signal $VO_{270}$ is 180° out of phase with signal $VO_{90}$, present at the drain of Q2. Because of the 180° phase inversion that occurs in the common source configuration, signal $VO_{270}$ further amplifies signal $VO_{90}$, effectively increasing the gain of the transistor stage to ensure oscillation. In the same manner, the gates of transistors Q1, Q3, and Q4 each receive a phase-inverted signal from the output of transistors Q3, Q1, and Q2, respectively.

Note that the oscillator in FIGS. 4a and 4b supplies quadrature waveforms, at phase angles of 0°, 90°, 180° and 270°. However, unlike prior art ring oscillators, the tank circuits operate at their resonant frequency, and are not detuned. Consequently, an oscillator embodying the principles disclosed herein is believed to offer superior frequency stability.

In many applications, such as clock recovery in high-speed data communications, it is necessary to vary the frequency of the multi-phase oscillator. The most common frequency modulation technique uses a voltage-variable capacitor (known as a "varactor") to adjust the capacitance in the tank circuit. Though convenient, this technique suffers from a number of shortcomings. For example, manufacturing tolerances often limit the practical capacitance adjustment range. Moreover, the Q of the tank circuit may be poor, due to the intrinsic resistance of the varactor.

In a preferred embodiment of the circuit and method disclosed herein, a voltage-controlled transconductance amplifier, derived from a differential amplifier, modulates the oscillation frequency. FIGS. 5a–d will be used to illustrate the fundamental characteristics of a differential amplifier that enable it to perform this function.

Figure 5A:
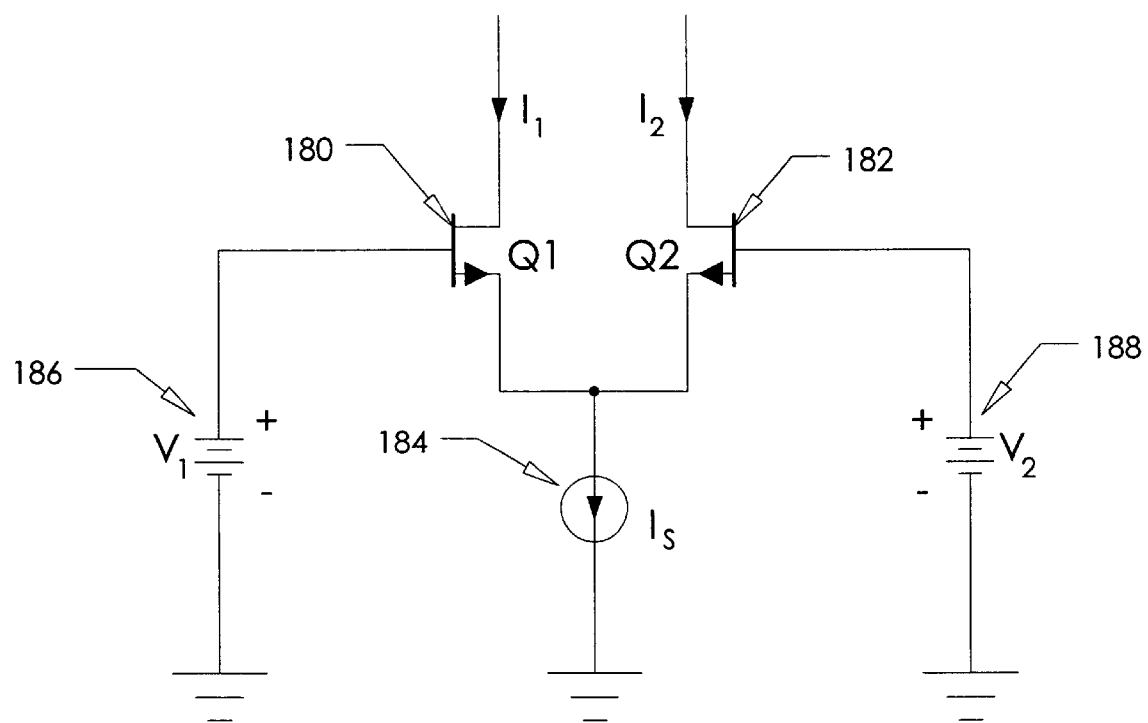
FIGS. 5a–d illustrate the use of a differential amplifier as a voltage-controlled gain stage.

The differential amplifier in FIG. 5a consists of two (ideally, matched) MOSFET transistors, Q1 180 and Q2 182, and a current source $I_S$ 184. An important property of a differential amplifier is that the sum of the currents in transistors Q1 and Q2 is always equal to the current source 184:

$$I_1 + I_2 = I_S$$

The input to the differential amplifier is represented as a pair of voltage sources, $V_1$ 186 and $V_2$ 188. Its output may be regarded as the current through transistors Q1 and Q2. When configured as shown in FIG. 5a, the output of a differential amplifier may be stated in terms the transistor current $I_1$ or $I_2$ vs. the differential input voltage. If the differential input voltage is zero, the differential output current is also zero:

$$\text{if } V_1 - V_2 = 0, \text{ then } I_1 - I_2 = 0$$

When the differential voltage is not zero, the following equations describe the transistor drain currents $I_1$ and $I_2$ as a function of the differential input voltage:

$$I_1 = \frac{I_S + g_m \cdot (V_1 - V_2)}{2}$$

$$I_2 = \frac{I_S + g_m \cdot (V_2 - V_1)}{2}$$

From these two equations, it follows that the differential output current vs. the differential input voltage is: $I_1 - I_2 = g_m \cdot (V_1 - V_2)$, where $0 \leq I_1 \leq I_S$, and where $g_m$ is the transconductance of Q1 and Q2.

Note that the preceding drain current equations treat gm as a constant. Actually, the transconductance of MOSFETs, such as Q1 and Q2, is dependent on drain current:

$$g_m(I_D) = g_m(I_{Dref}) \cdot \sqrt{\frac{I_D}{I_{Dref}}}$$

where $I_D$ is drain current, and Iref is some reference value of drain current. This equation predicts that MOSFET transconductance increases as the square root of the increase in drain current. For example, a MOSFET with a transconductance of 5 mA/V at a drain current of 1 mA, will have a transconductance of 10 mA/V at a drain current of 4 mA. This property of MOSFETs can be exploited to create voltage-controlled amplifiers. By varying the current source $I_S$ in the differential amplifier of FIG. 5a, it is possible to modulate the amplitude of the differential output current $I_1 - I_2$, for a given differential input voltage V1–V2. It should be noted that, although the active devices in FIG. 5a are MOSFETs, other types of transistors (such as bipolar transistors) may be used in the same manner to achieve voltage-controlled gain.

Figure 5C:
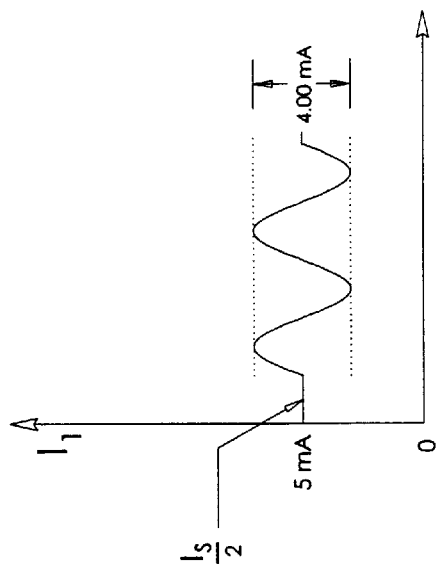
Figure 5D:
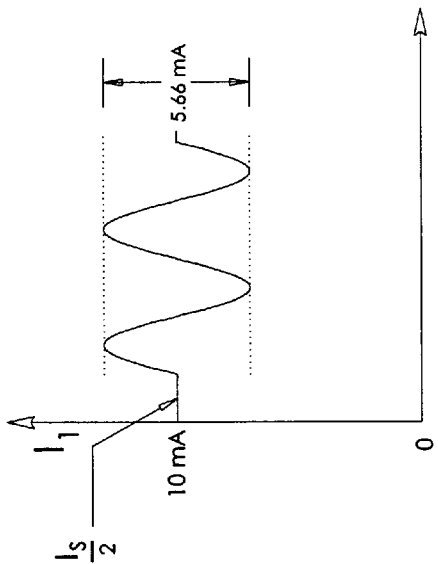
Figure 5B:
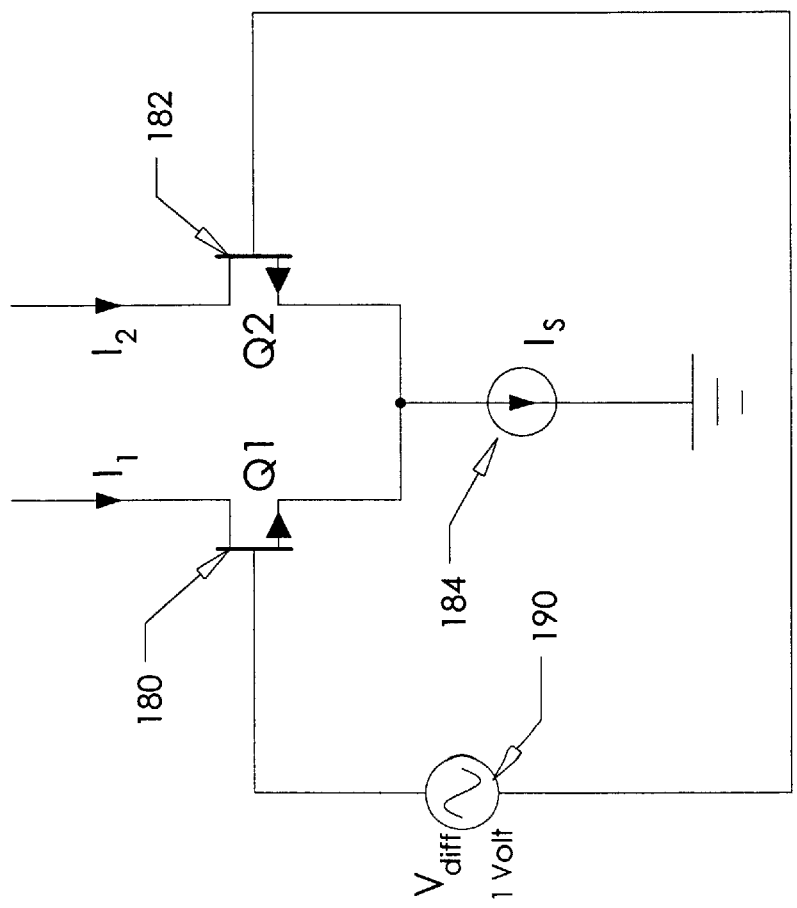

In the above expressions for $I_1$ and $I_2$, the term $I_S/2$ represents the "operating point," or "bias point" of the differential amplifier. This is because transistor currents $I_1$ and $I_2$ fluctuate above and below this value in response to the differential input voltage $V_1 - V_2$. FIG. 5b shows the differential amplifier represented in FIG. 5a, but with DC input voltage sources $V_1$ and $V_2$ replaced by a differentially-connected AC voltage source $V_{diff}$ 190, with a level of 1 Volt. The sinusoidal voltage $V_{diff}$ causes a sinusoidal variation in the current $I_1$ about its operating point. If current source $I_S$ 184 is set to 10 mA, this operating point will be 5 mA for both $I_1$ and $I_2$. This is shown in FIG. 5c, where it is assumed that the $g_m$ of MOSFETs Q1 and Q2 at 5 mA drain current results in a 4.00 mA sinusoidal current. If $I_S$ is doubled, as illustrated in FIG. 5d, the operating point for $I_1$ becomes 10 mA. Furthermore, because gm increases as the square root of the increase in drain current, the amplitude of the sinusoidal current $I_1$ becomes approximately 5.66 mA. Thus, altering the drain current changes both the operating point and the gain of the differential amplifier. For AC signals, the output of the differential amplifier can be coupled through a capacitor, so the shift in operating point is of no consequence.

Figure 6:
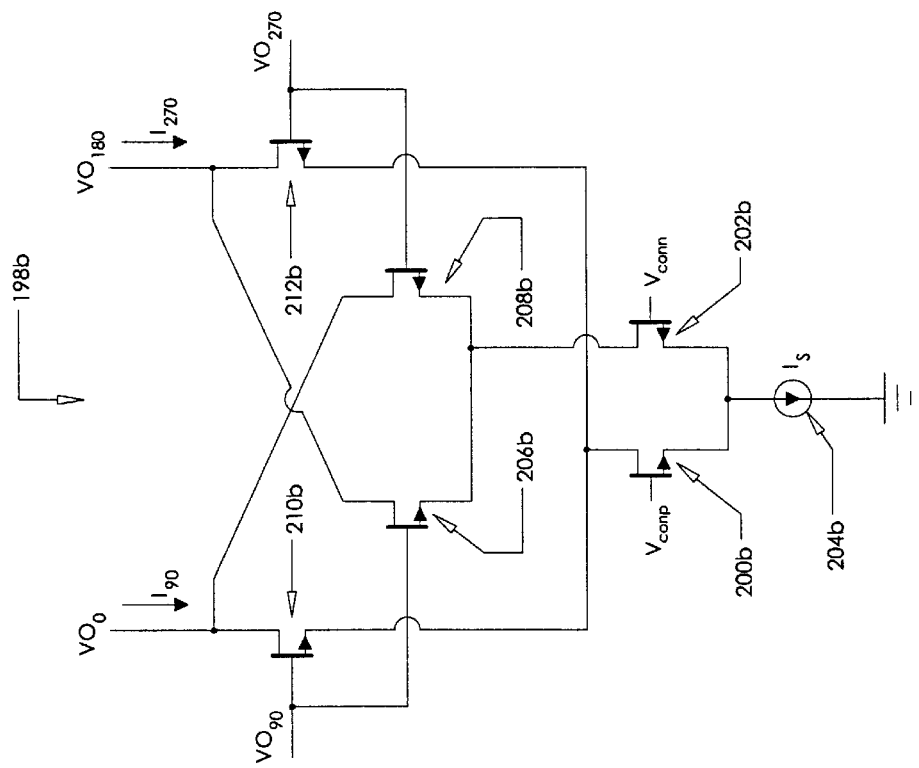
FIG. 6 represents an embodiment of a frequency modulator, based on the voltage-controlled gain stage shown in FIG. 6.
Figure 6:
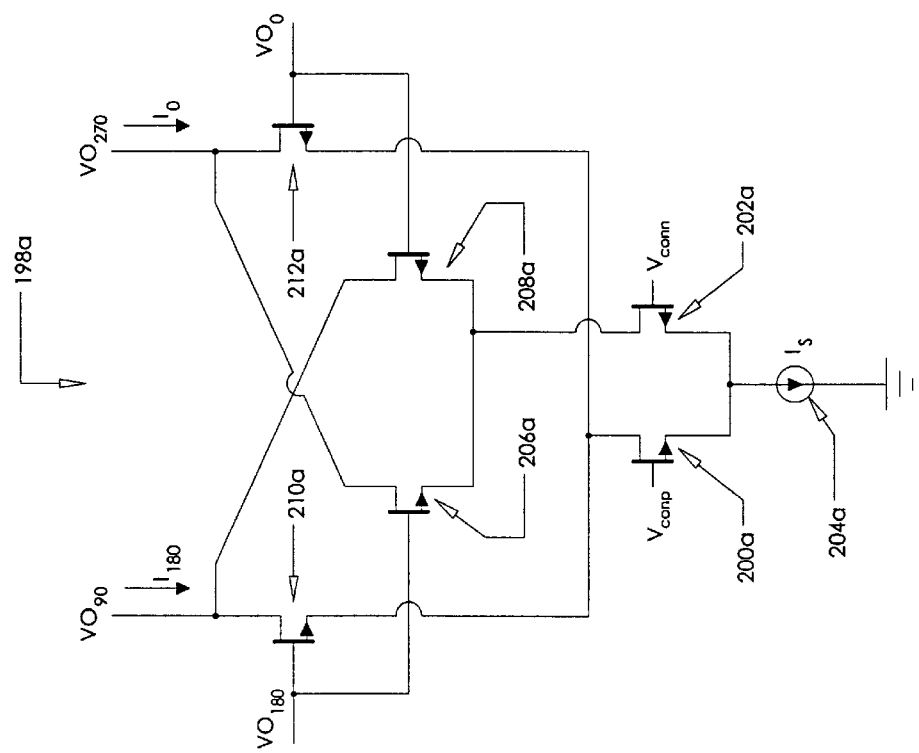

The circuit shown in FIG. 6 is an embodiment of the method disclosed herein for modulating the frequency of an oscillator. This circuit is similar to a "Gilbert cell," a classic circuit for analog multiplication (U.S. Pat. No. 4,156,283 to Barrie Gilbert). According to this method, a differential amplifier is used to couple quadrature signal currents into the tank circuits of the oscillator. Making use of the dependence of transconductance on drain current, the gain of the differential amplifier may be varied under the influence of a control voltage. As discussed above, a voltage-controlled transconductance amplifier can be employed to modulate the frequency of the oscillator. The modulator is an integral part of the multi-phase VCO disclosed herein, therefore the following discussion of the circuitry represented in FIG. 6 will also make reference to the oscillator circuit of FIG. 4b.

The complete modulator for a four-phase VCO comprises two identical sections 198a and 198b, shown in FIG. 6. Accordingly, item numbers of corresponding components in each section have an "a" or "b" appended. Each section may be understood as a compound differential amplifier, in which a primary differential amplifier serves as a voltage-controlled current source for a secondary differential amplifier. Since the two sections shown in FIG. 6 are identical, the following discussion will be confined to section 198a. From the previous explanation of the operation of the differential amplifier shown in FIG. 5a, it will be evident that the differential voltage $V_{conp}-V_{conn}$ determines the portion of the current $I_S$ that is conducted by each of the MOSFETs 200a and 202a. Note that MOSFET 200a serves as a current source for MOSFETs 210a and 212a, which are connected as a differential amplifier pair, with differential input signals $VO_{180}$ and $VO_0$. Similarly, MOSFET 202a serves as a current source for MOSFETs 206a and 208a, which are also configured as a differential amplifier, and also receive differential input signals $VO_{180}$ and $VO_0$. Also note that the drains of MOSFETs 206a and 212a are connected together, as are the drains of MOSFETs 210a and 208a.

Due to the dependence of MOSFET transconductance upon drain current, the gain (i.e., the ratio of differential output current to differential input voltage) of the differential pair 206a and 208a can be made to vary according to the amount of current conducted by MOSFET 202a. Likewise, the gain of MOSFET pair 210a and 212a depends on the current conducted by MOSFET 200a. The ratio of the current in MOSFET 200a to that in MOSFET 202a, in turn, depends on the differential control voltage $V_{conp}-V_{conn}$, with the combined current being $I_S$.

MOSFETs 206a and 210a receive phase output $VO_{180}$ from the oscillator (134c in FIG. 4b), while MOSFETs 208a and 212a receive phase output $VO_0$ (134a in FIG. 4b). The output current from MOSFETs 206a and 212a, $I_0$, is coupled to phase output $VO_{270}$ (134d in FIG. 4b). Similarly, the output current from MOSFETs 208a and 210a, $I_{180}$, is coupled to phase output $VO_{90}$ (134b in FIG. 4b). These output currents combine with the currents in the tank circuit as described in detail below. Furthermore, current $I_0$ is 90° out of phase with the signal $VO_{270}$, and $I_{180}$ is 90° out of phase with $VO_{90}$. In other words, drain currents $I_0$ and $I_{180}$ comprise quadrature modulation currents.

When $V_{vonp}=V_{conn}$, the differential amplifier consisting of MOSFETs 200a and 202a is balanced—i.e., both MOSFETs conduct half the current $I_S$ from current source 204a. MOSFETs 206a–212a then each conduct a current of $I_S/4$, since each differential pair receives $I_S/2$, and the current divides equally between the transistors in each pair. Note that the complementary signals applied to the gates of cross-coupled MOSFETs 210a/208a and 206a/212a cancel each other when the modulator is in a balanced state, resulting in an absence of modulation current. In a sense, MOSFETs 206a and 212a oppose each other, as do MOSFETs 210a and 208a. When both MOSFETs in an opposing pair have the same gain, their output currents cancel. But if either MOSFET in an opposing pair has a higher gain, one of the voltage inputs, $VO_{180}$ or $VO_0$, will predominate and result in non-zero modulation currents $I_{180}$ and $I_0$.

Now, if $V_{conp}>V_{conn}$, the differential pair consisting of 210a and 212a will receive a larger portion of the current $I_S$. Because MOSFET transconductance increases at higher drain currents, this causes MOSFET 210a to amplify signal $VO_{180}$ more than its opposing MOSFET 208a amplifies complementary signal $VO_0$. Similarly, MOSFET 212a amplifies $VO_0$ more than opposing MOSFET 206a amplifies $VO_{180}$. Under these circumstances, a non-zero modulation current $I_{180}$ results from input voltage $V_{180}$, while the current $I_0$ is created by $V_0$. The exact opposite occurs when $V_{conn}>V_{conp}$. An increased portion of the current $I_S$ is then directed by MOSFET 202a to differential pair 206a/208a, raising their transconductance. As a result, the current $I_{180}$ is induced by $VO_0$, and current $I_0$ by $V_{180}$. Note that this is equivalent to a sign change in the amplification, since $VO_0=-VO_{180}$. It will be shown below that, depending on the sign of $g_m$, the resonant frequency either increases or decreases with an increase in the magnitude of $g_m$. Therefore, the oscillation frequency of the oscillator may be modulated by the differential control voltage $\Delta V=V_{conp}-V_{conn}$ in FIG. 6. The magnitude of $\Delta V$ determines the amount by which the resonant frequency changes, and its sign determines whether the change is an increase or a decrease. The operation of section 198b of the modulator and its interaction with the oscillator is analogous to that of section 198a, and no separate discussion of it is necessary.

Figure 7:
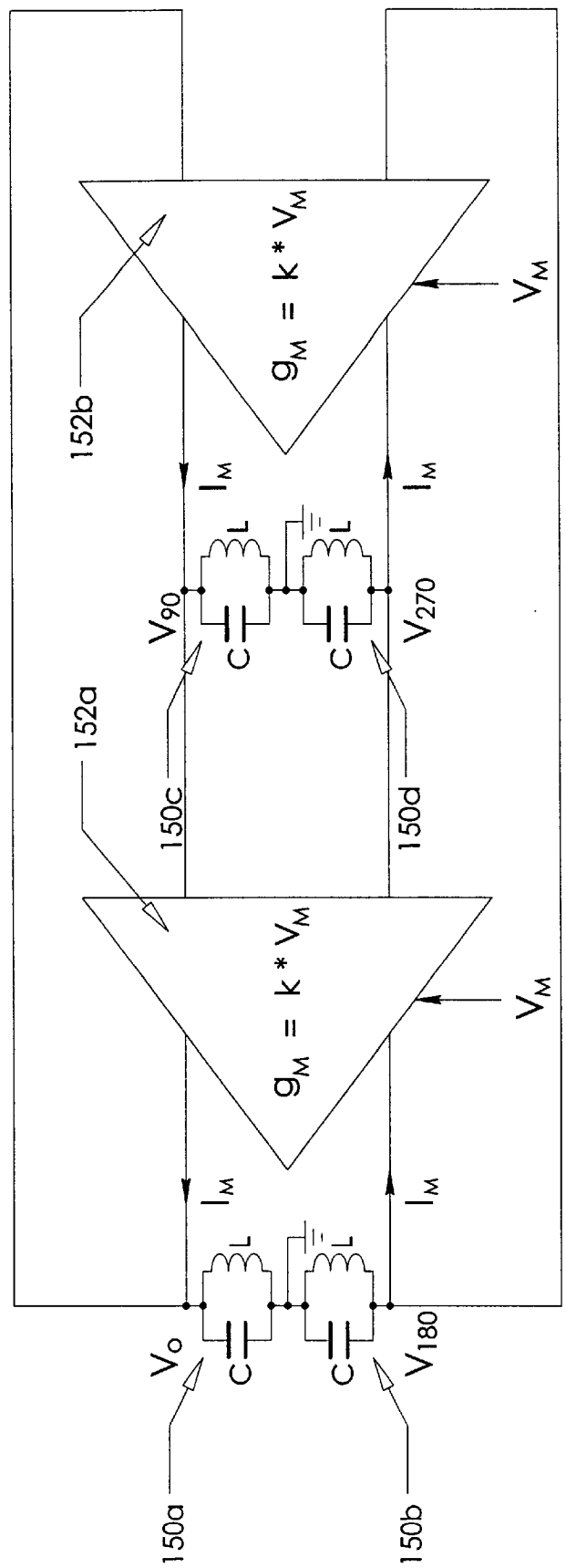
FIG. 7 illustrates the use of a modulation voltage to adjust the resonant frequency of a quadrature oscillator, according to an embodiment of the principles disclosed herein.

FIG. 7 contains a schematic representation of an oscillator such as the one shown in FIGS. 4a and 4b and described in the preceding paragraphs, and will be used to illustrate the effect of the modulation current on the oscillation frequency of the oscillator. The circuit is represented as a two-stage oscillator, each stage consisting of a pair of parallel resonant (tank) LC circuits 150a–b and 150c–d, and an associated transconductance amplifier 152a and 152b. As with the oscillator of FIGS. 4a and 4b, oscillation occurs at the resonant frequency of the tank circuits, with the signal at each stage offset by a phase angle of 90° from that of the previous stage. Thus, $V_0$ appears across tank circuit 150a, $V_{90}$ across tank circuit 150b, $V_{180}$ across tank circuit 150c, and $V_{270}$ across tank circuit 150d. The transconductance amplifier for each stage supplies modulation currents $I_M$, which are injected into the respective resonant LC circuits to adjust their oscillation frequency (as described in detail below). $I_M$ for each transconductance amplifier is proportional to a differential input voltage taken from the tank circuit of the opposite oscillator stage. Thus, for example, transconductance amplifier 152a receives the difference of $V_{90}$ and $V_{270}$ across tank circuits 150c and 150d. As before, the transconductance $g_m$ of the amplifier (defined as the ratio of output current to input voltage) is proportional to the modulation voltage $V_M$.

The operation of the modulation circuitry will now be described with reference to FIG. 7. The following analysis will focus on tank circuit 150a, but because of the symmetry of the circuit, the other resonant sections behave identically. For simplicity, it is assumed that the transconductance amplifier is ideal—i.e., it has infinite input impedance and infinite bandwidth. Then, there are three currents flowing into or out of the tank circuit 150a: a capacitor current $I_C$, and inductor current $I_L$, and a modulation current $I_M$.

the capacitor current is:

$$I_C = \frac{V_O}{\frac{1}{s \cdot C}} = V_O \cdot s \cdot C$$

the inductor current is:

$$I_L = \frac{V_O}{s \cdot L}$$

and the modulation current is:

$$I_M = \frac{g_m}{2} \cdot (V_{90} - V_{270})$$

Note that the last expression above is the AC transconductance of a differential amplifier. Since $V_{270} = -V_{90}$, the equation for the modulation current simplifies to:

$$I_M = \frac{g_m}{2} \cdot 2 \cdot V_{90} = g_m \cdot V_{90}$$

Furthermore, the modulation current can be expressed in terms of $V_0$, since $V_{90}$ is a simply a 90° phase-shifted version of $V_0$.

$$I_M = g_m \cdot V_{90} = e^{j\pi/2} \cdot g_m \cdot V_0 = j g_m \cdot V_0$$

Note that the modulation current in this case is derived from the voltage across one of the other tank circuit nodes.

The sum of all $I_C$, $I_L$ and $I_M$ must equal zero:

$$V_O \cdot \left[ s \cdot C + \frac{1}{s \cdot L} + j g_m \cdot V_0 \right] = 0$$

Dropping $V_0$ and substituting $s = j\omega$ into the above equation, yields:

$$j\omega \cdot C - \frac{j}{\omega \cdot L} + j g_m = 0$$

The solution to this equation is:

$$\omega = \frac{-g_m}{2 \cdot L \cdot C} + \sqrt{\left(\frac{-g_m}{2 \cdot C}\right)^2 + \frac{1}{L \cdot C}}$$

which can be simplified by expanding it as a power series, and then truncating after the second term:

$$\omega = \omega_0 - \frac{g_m(V_M)}{2 \cdot C} + \frac{g_m(V_M)^2}{8 \cdot C^2 \cdot \omega_0} - \text{where } \omega_0 = \frac{1}{\sqrt{L \cdot C}}$$

In the above expression for the modulated oscillator frequency, the voltage dependence of the transconductance term $g_m$ has been explicitly shown. Thus, the frequency of the oscillator can be made to vary about the resonant frequency $\omega_0$ of the tank circuit, as a function of the modulation voltage applied to the transconductance amplifier (152a and 152b in FIG. 7).

As discussed earlier, in some applications it is necessary to have an 8-phase VCO. It will now be shown that the multi-phase oscillator circuit and method disclosed herein may be readily generalized to obtain 8, or other integer number of phases. The circuit topology for an 8-phase VCO will be similar to that of the 4-phase circuit, consisting of multiple oscillator sections, with the output signal from the last section fed back to the input of the first section. A requirement for this multi-stage "ring" configuration is for a total phase shift of 360° from input to output. This requirement was met in the 4-phase oscillator considered above, by implementing a phase shift of 90° per section. For an 8-phase oscillator, then, a phase shift of 45° per section is required. However, in order to modulate the frequency of the 8-phase oscillator according the techniques disclosed herein, a quadrature current (with voltage-controlled sign and magnitude) must be coupled to the tank circuit of each of the 8 sections. The following paragraph, making reference to FIGS. 8a and 8b, describes how this is accomplished.

Figure 8A:
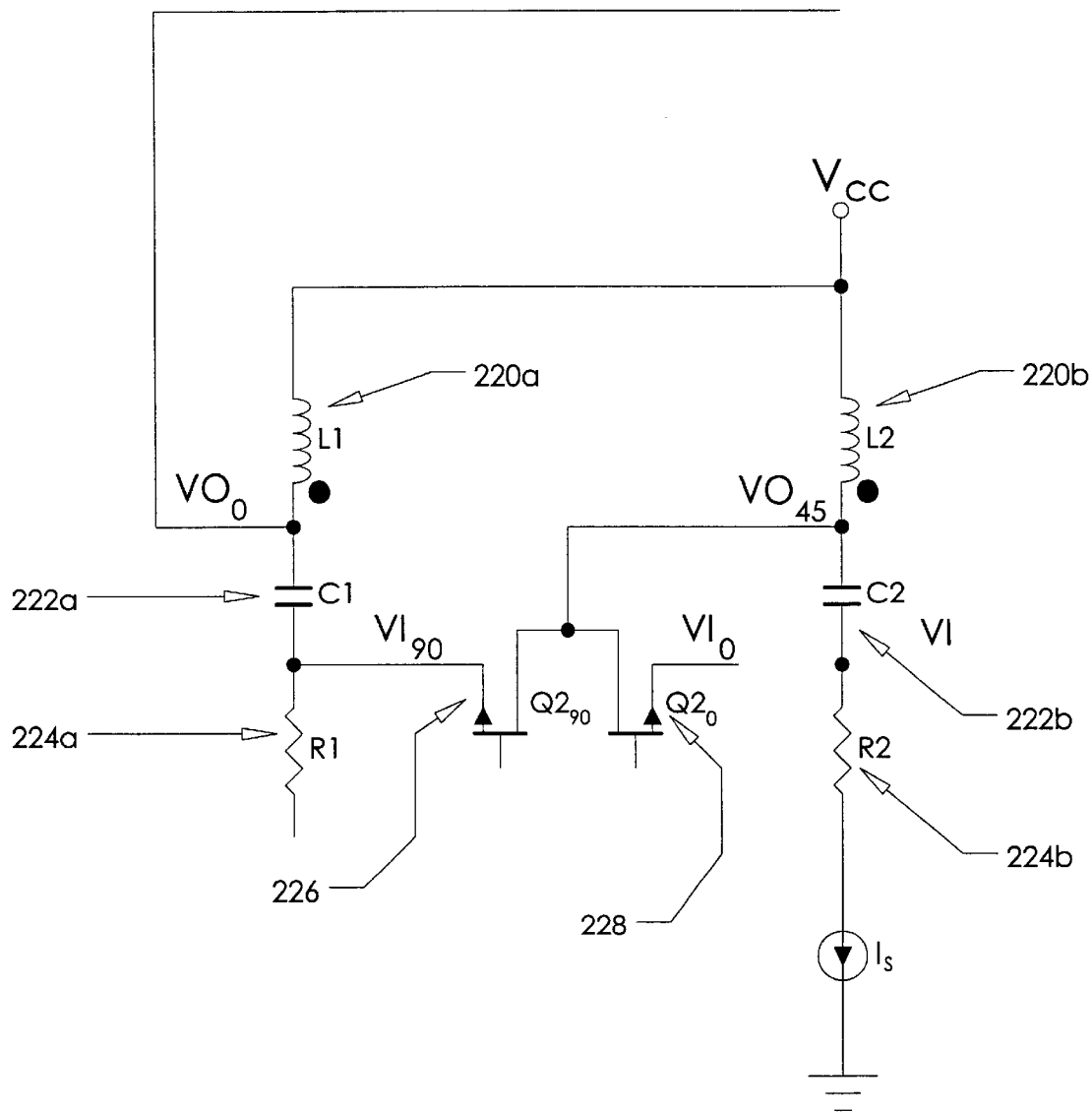
FIGS. 8a–b illustrate one section of an 8-phase oscillator, embodying the principles disclosed herein.

FIG. 8a shows the tank circuit (L1 220a, C1 222a) and capacitor current-sensing resistor (R1 224a) for the 1st of the 8 sections, along with the corresponding components (L2 220b, C2 222b and R2 224b) for the $2^{nd}$ section. Also shown, are a pair of MOSFET transistors (Q2$_{90}$ 226 and Q2$_0$ 228) which drive the $2^{nd}$ section. Under the assumption of 45° of phase between successive sections of the oscillator, the voltage VO$_0$ is present at the junction of L1 220a and C1 222a, while voltage VO$_{45}$ is present at the junction of L2 220b and C2 222b. If the gates of Q2$_{90}$ 226 and Q2$_0$ 228 are held at a fixed voltage, both transistors operate as "common gate" amplifiers, which produce voltage amplification with no phase shift. Thus, the current at the drain of Q2$_{90}$ is in phase with VO$_{90}$, and the current at the drain of Q2$_0$ in phase with VO$_0$. The combination of these two signals gives:

$$\sin(\omega \cdot t) + \sin(\omega \cdot t + 90°) = 2 \cdot \cos(45°) \cdot \sin(\omega \cdot t + 45°) = \sqrt{2} \cdot \sin(\omega \cdot t + 45°)$$

Thus, a voltage with a phase angle of 0° and a voltage with a phase angle of 90° are combined by Q2$_{90}$ and Q2$_0$ to yield a current with a phase angle of 45°.

Figure 8B:
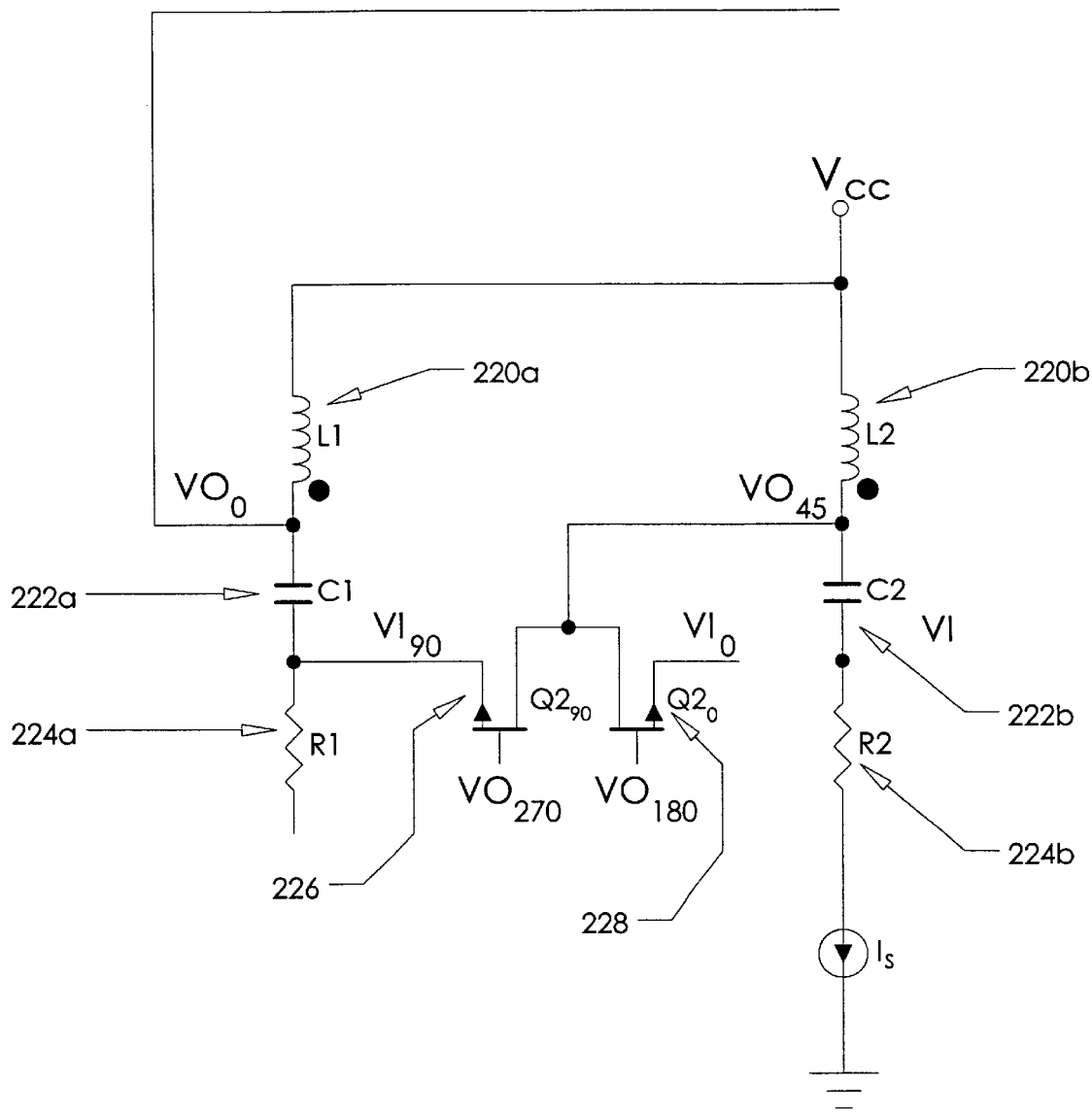

In FIG. 8b, the gates of Q2$_{90}$ 226 and Q2$_0$ 228 are driven by VO$_{270}$ and VO$_{180}$, respectively. The signal at the gate of each transistor is then 180° out of phase with the signal at the source. This effectively converts the transistor stages from "common gate" to combination "common source/common gate" amplifiers, and the required power gain for oscillation. The other 7 sections of the 8-phase VCO are configured similarly.

Figure 9:
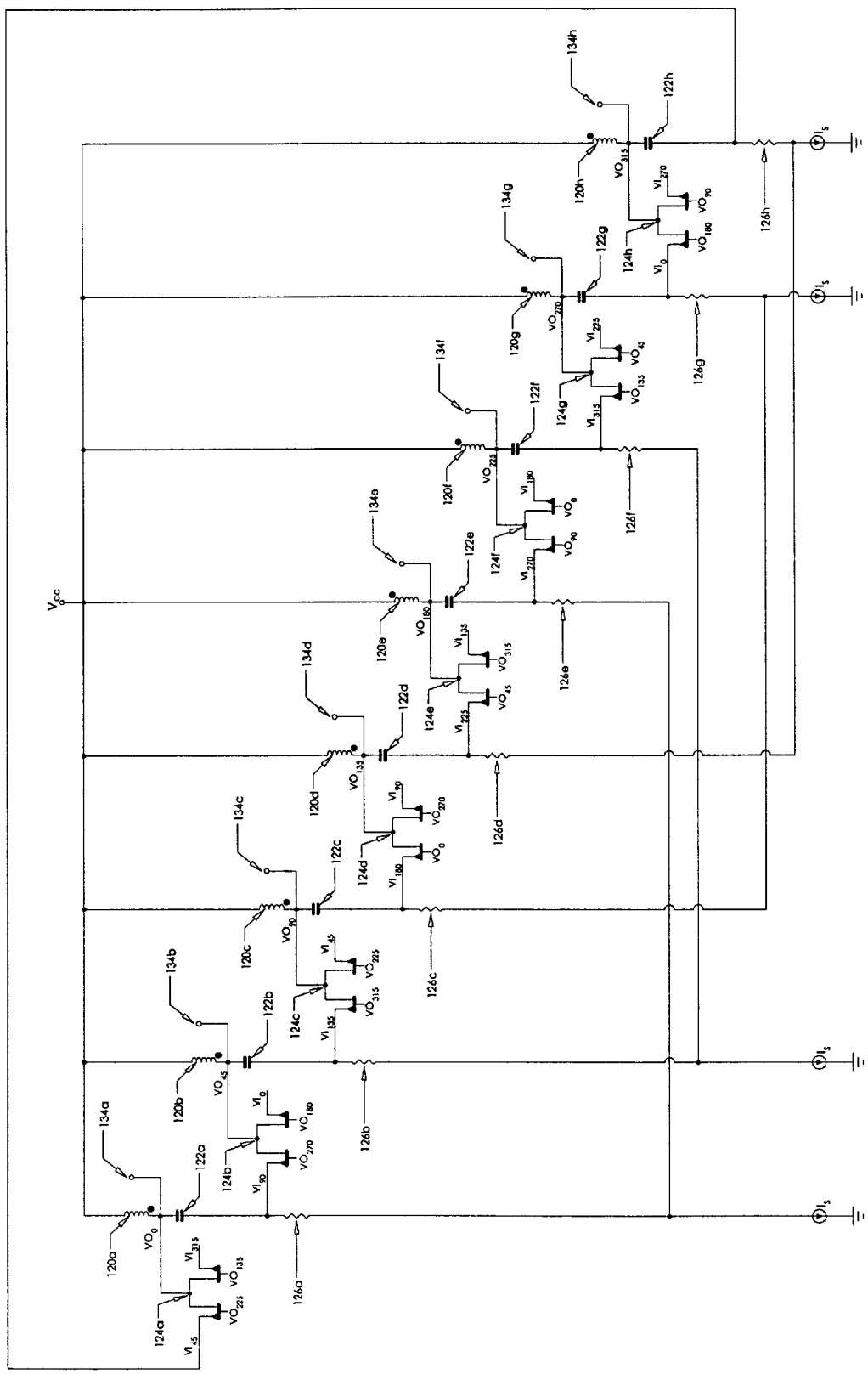
FIG. 9 represents all 8 sections of an 8-phase oscillator, embodying the principles disclosed herein.

FIG. 9 shows all 8 sections of an 8-phase embodiment of the multi-phase VCO disclosed herein. Corresponding components in each section have the same item number, with the letter "a"–"h" appended, to indicate the section. For example, the inductor in the $3^{rd}$ section is labeled 120c, while the one in the $7^{th}$ section is labeled 120g. Each section contains a resonant tank circuit, comprised of inductors 120a–h and capacitors 122a–h. Sense resistors 126a–h establish a voltage proportional to the capacitor current in the respective tank circuit. Note that the circuit topology is fundamentally the same as for the 4-phase version, except that there is a 45° (rather than a 90°) phase shift associated with each of the oscillator sections. The oscillator circuit is organized as 4 pairs of complementary sections—where each complementary pair produces output signals that are 180° out of phase with each other. Moreover, each complementary pair has mutually coupled inductors and shares a current source.

As in the 4-phase VCO, each section derives a quadrature signal by sensing the capacitor current in an adjacent oscillator section (using resistors 126a–h). However, unlike the 4-phase case, the drive for the tank circuit cannot be directly based on the quadrature signal, since a 45° (rather than 90°) section-to-section phase shift is desired. Consequently, MOSFET pairs 124a–h are used to combine quadrature signals and create the 45° phase-shifted signals present at the output 134a–h of each of the 8 sections. For example, MOSFET pair 124f combines signals $VI_{270}$ and $VI_{180}$. As shown above, the result is a signal with an intermediate phase angle:

$$\sin(\omega \cdot t+180°)+\sin(\omega \cdot t+270°)=2\cdot\cos(45°)\cdot\sin(\omega \cdot t+225°)$$

Thus, the output signal 134f from MOSFET pair 124f ($VO_{225}$) has a phase angle of 225°, as required to drive the tank circuit comprised of inductor 120f and capacitor 122f.

Figure 10:
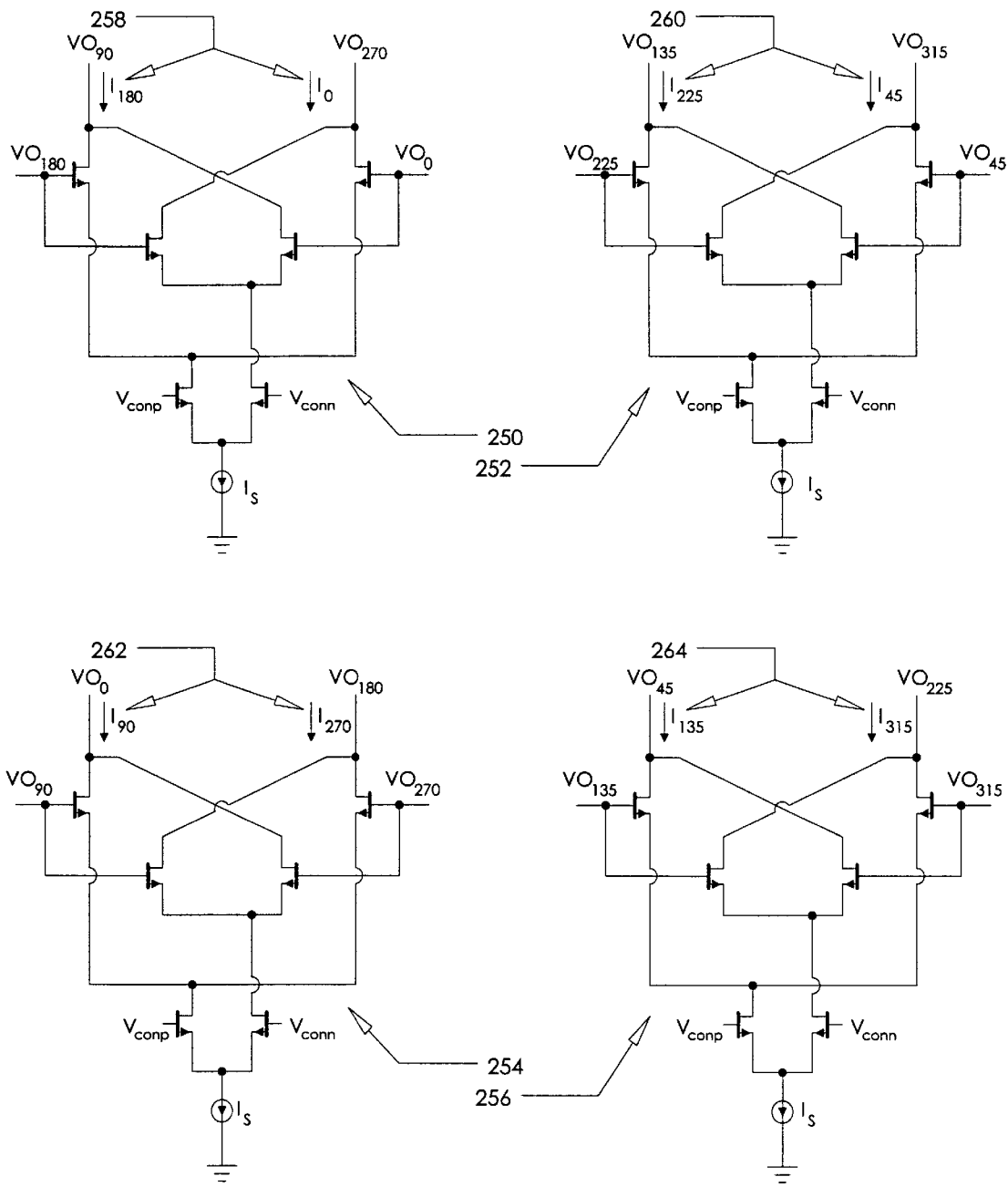
FIG. 10 represents an embodiment of a frequency modulator for the 8-phase oscillator shown in FIG. 9.

The modulator for the 8-phase VCO shown in FIG. 9 is analogous to the one used with the 4-phase oscillator. A schematic representation of the modulator for the 8-phase VCO is shown in FIG. 10. Each of the 4 compound differential amplifiers 250–256 produces a pair of complementary (180° out of phase with each other) modulation signals 258–264. Each pair of modulation signals interacts with the tank circuits of one of the complementary pairs of oscillator sections, raising or lowering the oscillation frequency. The principles by which this occurs have already been covered, and no detailed discussion of it will be given here.

The oscillator circuit disclosed herein must contain an even number of stages. So if an odd number of phases is required, the oscillator must be constructed with twice that number of stages, and a phase output taken from every. other stage. For example, if three output phases (at 0°, 120° and 240°) are desired, a six-stage oscillator would be built, and outputs taken from the 1st, 3rd and 5th stages.

A circuit and method for a multi-phase voltage-controlled oscillator have been presented. Advantageously, the oscillator frequency is determined by a resonant tank circuit, which enhances frequency stability. Furthermore, frequency modulation of the oscillator is accomplished without the use of varactors, or other voltage-variable reactances. This permits a wide frequency adjustment range, while avoiding many of the shortcomings associated with varactor-tuned oscillators. The circuit and method disclosed herein are well suited for use in integrated circuits, and may be adapted to develop oscillators with arbitrarily many output phases.

It will be appreciated by those skilled in the art having the benefit of this disclosure that the embodiments described are believed applicable to the design of a multi-phase oscillator with voltage modulation of the oscillation frequency. Although illustrated with reference to MOSFET transistors, the circuit and method disclosed herein may be adapted to use other types of field effect or bipolar transistors. Furthermore, although the exemplary embodiments presented herein comprise 4 or 8 phases, it should be understood that the principles disclosed herein are applicable to other numbers of phases. In fact, the number of oscillator sections is subject only to the requirement:

$$N = 4 \cdot \left(\frac{90°}{\Delta\varphi}\right)$$

where N is the number of oscillator sections, and $\Delta\phi$ (the phase offset from one oscillator section to the next) is a factor of 90°. For example, if $\Delta\phi=45°$, the oscillator has 8 sections, while $\Delta\phi=6°$ results in a 60-phase oscillator.

Accordingly, the specification and drawings are to be regarded in an illustrative rather than a restrictive sense as to possibly numerous architectures, circuitry, and methodologies which fall within the spirit and scope of the present invention.

What is claimed is:

1. An oscillator, comprising:
   multiple transconductance amplifiers, each of which have a gain dependent on a control voltage;
   multiple sections, each of which comprise an inductor and capacitor pair adapted to receive a modulation signal from a transconductance amplifier of the multiple transconductance amplifers; and
   multiple amplifiers, each of which is coupled to produce a signal forwarded to a respective said inductor and capacitor pair for resonating said multiple sections at the same frequency but offset by a phase differential.

2. The oscillator circuit as recited in claim 1, wherein each one of said multiple sections receives a signal one hundred and eighty-degrees out of phase with a signal input to a corresponding one of said amplifiers.

3. The oscillator circuit as recited in claim 1, wherein each of said multiple amplifiers comprises at least one active device, such as a MOSFET, bipolar transistor, or operational amplifier.

4. The oscillator circuit as recited in claim 1, wherein each of the multiple sections and multiple amplifiers are embodied upon a singular substrate to form at least a portion of an integrated circuit.

5. The oscillator circuit as recited in claim 1, wherein the transconductance amplifier associated with each of said multiple oscillator sections is adapted to receive an input signal from another section.

6. The oscillator circuit as recited in claim 1, wherein the transconductance amplifiers are implemented with suitable active devices, such as MOSFETs, or bipolar transistors.

7. The oscillator as recited in claim 1, wherein the number of multiple sections is four times ninety degrees divided by n, where n is an integer factor of ninety.

8. A method for producing an oscillating output, comprising:
   forwarding a plurality of signals into a respective plurality of inductor and capacitor pairs for inducing a signal resonating at an oscillation frequency within each of said inductor and capacitor pairs, but offset by a phase differential; and
   providing the resonating signal offset by a phase differential as separate and distinct output external from an oscillator comprising the plurality of inductor and capacitor pairs
   providing an amplifier corresponding to each inductor and capacitor pair with a signal 180° out of phase with a drive signal that resonates within a respective inductor and capacitor pair, to obtain additional gain.

9. The method as recited in claim 8, further comprising inputting a signal at the oscillation frequency into one of the plurality of inductor and capacitor pairs but offset by a phase differential from the phase of the voltage across said one of the plurality of inductor and capacitor pairs to initiate the oscillating output.

10. The method as recited in claim 8, wherein the phase angle of a resonating signal provided at the output of the nth pair of said plurality of inductor and capacitor pairs is n times 360 degrees divided by the total number of said inductor and capacitor pairs.

11. The method as recited in claim 8, wherein the amplifier comprises at least one active device, such as a MOSFET, bipolar transistor, or operational transconductance amplifier.

12. A method for modulating the oscillation frequency of an oscillator, comprising:
   coupling a signal of the same frequency as that of the oscillator but of variable amplitude into an inductor-capacitor circuit of the oscillator, said signal having a phase offset with a magnitude of substantially ninety degrees with respect to a voltage across said circuit; and selecting a first polarity of said signal and increasing the amplitude of the signal, to increase the oscillation frequency above the resonant frequency of the inductor-capacitor circuit; and selecting a second polarity of said signal, opposite to the first polarity, and increasing the amplitude of the signal, to decrease the oscillation frequency below the resonant frequency of the inductor-capacitor circuit.

13. The method as recited in claim 12, wherein the signal is derived from a transconductance amplifier, the gain of which is dependent on a control voltage.

14. The method as recited in claim 12, wherein the oscillator further comprises a total number of sections, each of which contains an inductor-capacitor circuit, and wherein the phase angle of a signal produced from the nth pair of said total number of sections is n times 360 degrees divided by the total number of said sections.

15. The method as recited in claim 14, wherein each oscillator section further comprises a transconductance amplifier, such that the transconductance amplifier within a given oscillator section is adapted to receive an input signal derived from the inductor-capacitor circuit of another oscillator section.

16. The method as recited in claim 15, wherein each transconductance amplifier is implemented with suitable active devices, such as MOSFETs, or bipolar transistors.

17. The method as recited in claim 15, wherein each of the total number of oscillator sections is embodied upon a singular substrate to form at least a portion of an integrated circuit.

18. The method as recited in claim 14, wherein the total number of sections may be any integer equal to four times ninety degrees divided by n, where n is an integer factor of ninety.

* * * * *

UNITED STATES PATENT AND TRADEMARK OFFICE
CERTIFICATE OF CORRECTION

PATENT NO. : 6,690,243 B1
DATED : February 10, 2003
INVENTOR(S) : Henrion

It is certified that error appears in the above-identified patent and that said Letters Patent is hereby corrected as shown below:

<u>Column 16,</u>
Line 8, delete "amplifers" and substitute therefor -- amplifiers --.
Lines 14-15, after the phrase "one hundred and eighty," delete "-.".
Line 41, delete "and".
Line 45, after the phrase "capacitor pairs," insert -- ; and --.

Signed and Sealed this

Thirteenth Day of December, 2005

JON W. DUDAS
*Director of the United States Patent and Trademark Office*